(12) United States Patent
Santoro et al.

(10) Patent No.: US 8,248,108 B2
(45) Date of Patent: Aug. 21, 2012

(54) COMPARATOR WITH OFFSET COMPENSATION, IN PARTICULAR FOR ANALOG DIGITAL CONVERTERS

(75) Inventors: Manuel Santoro, Milan (IT); Fabio Bottinelli, Malnate (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 4 days.

(21) Appl. No.: 12/727,104

(22) Filed: Mar. 18, 2010

(65) Prior Publication Data
US 2010/0237907 A1 Sep. 23, 2010

(30) Foreign Application Priority Data
Mar. 18, 2009 (IT) .............................. TO2009A0207

(51) Int. Cl.
*H03K 5/22* (2006.01)
(52) U.S. Cl. .................... 327/63; 327/65; 327/67; 330/9
(58) Field of Classification Search ................. 327/63, 327/65, 67; 330/9
See application file for complete search history.

(56) References Cited

U.S. PATENT DOCUMENTS
6,750,704 B1 * 6/2004 Connell et al. .............. 330/9
7,400,279 B2 * 7/2008 Krymski ...................... 341/118
2006/0164125 A1 7/2006 Mulder

OTHER PUBLICATIONS

Italian Search Report and Written Opinion dated Sep. 25, 2009, from corresponding Italian Application No. TO20090207.

Apisak Worapishet et al.; *Speed and Accuracy Enhancement Techniques for High-Performance Switched-Current Comparators* IEEE Journal of Solid-State Circuits, IEEE Service Center, Piscataway, NJ, vol. 36, No. 4, Apr. 1, 2001, pp. 687-689 XP011061500.
Shimizu, Y et al., *A 30mW 12b 40MS/s Subranging ADC With a High-Gain Offset-Canceling, Positive-Feedback Amplifier in 90nm digital CMOS*, Solid-State Circuits, 2006 IEEE International Conference Digest of Technical papers, Feb. 6-9, 2006, Piscataway, NJ, IEEE Feb. 6, 2006, pp. 802-811 XP010940464.
Matsuzawa, A, *Design Challenges of Analog-to-Digital Converters in Nanoscale CMOS*, IEICE Transactions on Electronics, Electronics Society, Tokyo, JP vol. E90Cm bi, 4m, Apr. 1, 2007, pp. 779-785, XP001541955.

(Continued)

*Primary Examiner* — John Poos
(74) *Attorney, Agent, or Firm* — Wolf, Greenfield & Sacks, P.C.

(57) ABSTRACT

A comparator formed by first and second stages. The second stage is formed by a pair of output transistors connected between a power-supply line and respective output nodes; a pair of bias transistors, connected between a respective output node and a current source; a pair of memory elements, connected between the control terminals of the output transistors and opposite output nodes; and switches coupled between the control terminals of the respective output transistors and the respective output nodes. In an initial autozeroing step, the first stage stores its offset so as to generate an offset-free current signal. In a subsequent tracking step, the second stage receives the current signal and the memory elements store control voltages of the respective output transistors. In a subsequent evaluating step, the first stage is disconnected from the second stage and the memory elements receive the current signal and switch the first and the second output node depending on the current signal. In subsequent comparisons, the tracking and evaluating steps follow one another without performing the autozeroing step.

18 Claims, 9 Drawing Sheets

OTHER PUBLICATIONS

Verma, N, et al., *An Ultra Low Energy 12-Bit Rate-Resolution Scalable SAR ADC for Wireless Sensor Nodes*, IEEE Journal of Solid-State Circuits, vol. 42, No. 6, Jun. 2007, pp. 1196-1205.

Shima,T et al., *Simple and Accurate Comparator Circuit*, Circuits and Systems, 2002,MWSCAS-2002, 45th Midwest Symposium, Pub. Aug. 4-7, 2002, vol. 1, pp. 299-302.

Razavi, B et al., *Design Techniques for High-Speed, High-Resolution Comparators*, IEEE Journal of Solid-State Circuits. vol. 27,No. 12,Dec. 1992, pp. 1916-1926.

Doernberg, J et al., *A 10-bit 5-Msample/s CMOS Two-Step Flash ADC*, IEEE Journal of Solid-State Circuits, Apr. 1989, vol. 24 No. 2, pp. 241-249.

\* cited by examiner

COMPARATOR WITH OFFSET COMPENSATION, IN PARTICULAR FOR ANALOG DIGITAL CONVERTERS

CROSS REFERENCE TO RELATED APPLICATIONS

This application claims the priority benefit of Italian patent application number TO2009A000207, filed on Mar. 18, 2009, entitled "COMPARATOR WITH OFFSET COMPENSATION, IN PARTICULAR FOR ANALOG DIGITAL CONVERTERS," which is hereby incorporated by reference to the maximum extent allowable by law.

BACKGROUND OF THE INVENTION

1. Field of the Invention

The present invention relates to a comparator with offset compensation, in particular for analog digital converters (ADCs) operating by successive approximations (ADC SAR—Analog Digital Converter Successive Approximation Register).

2. Discussion of the Related Art

As is known, precision is an important requirement for comparators; techniques ensuring a reliable correction of the existing offset due to the mismatch among physical components forming the converter are therefore required.

Several solutions have been suggested for correction of the offset.

A first solution, shown in FIG. 1 and disclosed in B. Razavi, B. Wooley "Design Techniques for High-Speed, High-Resolution Comparators", IEEE Journal of Solid-State VOL. M7, N. 12, December 1992, comprises N preamplifier stages 1 upstream of a latch 2 having an offset. The offset of preamplifiers 1 is detected in an initial autozeroing step, by shorting the inputs of preamplifiers 1 at a preset voltage and sampling the outputs of preamplifiers 1. Thereby, the offset of latch 2 is reduced, as it is divided by the product of the gains of preamplifiers 1 (1/(G1* . . . Gi* . . . *GN), Gi representing the gain of a generic preamplifier 1. Preamplifier stages 1 are generally low-gain (~2-3) in order to have a good band/consumption ratio. Accordingly, in order to sufficiently reduce the offset of latch 2, a certain number of preamplifier stages needs to be provided, thereby the overall comparison time is rather long and depends on the desired level of reduction of the offset. Furthermore, the circuit has a considerable bulk and a high power consumption.

Another solution, shown in FIG. 2 and disclosed in N. Verma, A. Chandrakasan "An Ultra Low Energy 12-bit Rate-Resolution Scalable SAR ADC for Wireless Sensor Nodes", IEEE Journal of Solid-State VOL. 42, N. 6, June 2007, uses a latched comparator with a single offset cancellation in the autozeroing step at the beginning of conversion, thus eliminating the need to perform the resampling of the offset after each comparison. Namely, transistors 3 and 4, operating as current sources, are biased so that input transistors 1, 2 have the same source voltages (VS1=VS2) when receiving identical input signals $V_{IN}$. This solution requires a rather complicated auxiliary circuitry for managing the different control steps, with a subsequent impact on the occupied area. Furthermore, the presence of local feedbacks leads to problems in the stability of the circuit in critical conditions.

A further solution, shown in FIG. 3 and disclosed in T. Shima, K. Miyoshi "Simple and Accurate Comparator Circuit", IEEE Circuits and Systems VOL. 1, August 2002, uses a latched comparator with offset cancellation at each comparison. This circuit is based on the storing, on capacitor C connected between the gate terminals of two transistors 5 and 6, of the difference in gate-source voltage of two transistors 5, 6 in the absence of a signal. Thereby, in the subsequent comparing step and then in the step latching, the output signal is independent of the offset. This solution has a less complicated structure than the previous one with respect to the auxiliary circuitry, but requires the inputs to be shorted before each comparison as the stored offset is lost after the comparison.

It is an object of the present invention to provide a comparator overcoming the drawbacks of the prior art.

SUMMARY OF THE INVENTION

According to at least one embodiment, the present invention provides a comparator, comprising a first stage and a second stage, the first stage being configured so as to receive a voltage input signal and generate a current signal, the second stage comprising a first and a second output transistor connected between a reference potential line and, respectively, a first and a second comparator output node, a pair of bias devices, connected between a respective comparator output node and an output bias current source, a first memory element, connected between a control terminal of the first output transistor and the second comparator output node, a second memory element, connected between a control terminal of the second output transistor and the first comparator output node, and bias switches coupled between a control terminal of a respective output transistor and a respective comparator output node.

According to at least one embodiment, the first stage comprises a first and a second converter output node, the comparator further comprising a pair of connection switches interposed between a respective converter output node and a respective comparator output node, the connection switches and the bias switches being configured so that, in a tracking step, the first stage is connected to the second stage and the first and second memory elements store a control voltage of the respective output transistor and, in a evaluating step, the first stage is disconnected from the second stage and the memory elements receive said current signal and switch said first and second output nodes according to said current signal.

According to at least one embodiment, the first and the second memory elements are capacitors.

According to at least one embodiment, the first stage comprises a first and a second input transistors and a first and a second load transistors interposed between the reference potential line and an input bias current source, said first and second input transistors being connected to said first and second load transistors at respective converter output nodes.

According to at least one embodiment, the comparator further comprises a third and a fourth memory element interposed between the control terminal of the first and, respectively, of the second load transistor and the reference potential line.

According to at least one embodiment, the first stage further comprises, an input circuit connected to said input transistors and configured so as to supply a reference signal in an autozeroing step and said input signal in a comparing step, a first and a second autozero switch interposed between a control terminal of a respective load transistor and a respective converter output node and configured so as to receive an autozero signal so that, in the autozeroing step, the load transistors are transdiode-connected and the third and fourth memory elements store a signal correlated to an offset of the first stage and, in the comparing step, the first and the second autozero switches are open and the first stage supplies the current signal to the converter output nodes.

According to at least one embodiment, the input circuit comprises a first switch interposed between a first comparator input and a control terminal of the first input transistor, a second switch interposed between a second comparator input and a control terminal of the second input transistor; a third switch interposed between the control terminal of the first input transistor and a common mode voltage and a fourth switch interposed between the control terminal of the second input transistor and the common mode voltage, the first and the second switch being configured so as to switch on in counterphase with respect to the third and fourth switches.

According to at least one embodiment, the comparator is included in an ADC SAR.

According to at least one embodiment, the present invention provides a method of comparing a voltage signal supplied to a comparator comprising a first stage receiving an input signal and a second stage outputting an output signal, including a tracking step and an evaluating step, the tracking step comprising generating a current signal related to the input signal by the first stage, connecting a pair of output transistors of the second stage between a reference potential line and respective comparator output nodes, supplying the current signal to the pair of output transistors through respective comparator output nodes, connecting control terminals of the output transistors to respective comparator output nodes, storing control voltages existing between each control terminal of the output transistors and an opposite output node, and the evaluating step comprising reciprocally disconnecting the first stage and the second stage, disconnecting the control terminals of the output transistors from the respective output nodes, and detecting the output signal on the comparator output nodes.

BRIEF DESCRIPTION OF THE DRAWINGS

For a better understanding of the present invention, a preferred embodiment thereof will now be disclosed by mere way of non-limitative example and with reference to the accompanying drawings, wherein.

DETAILED DESCRIPTION

Figure 1:
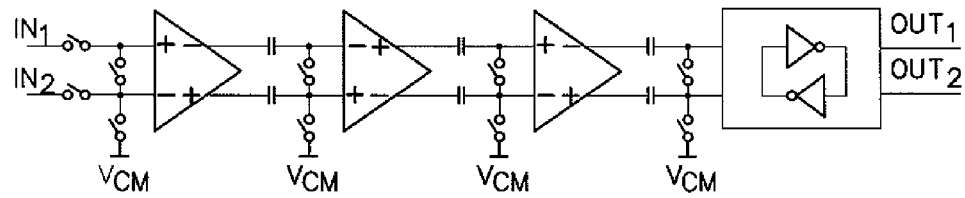
FIG. 1 is a circuit diagram of a first known solution.
Figure 2:
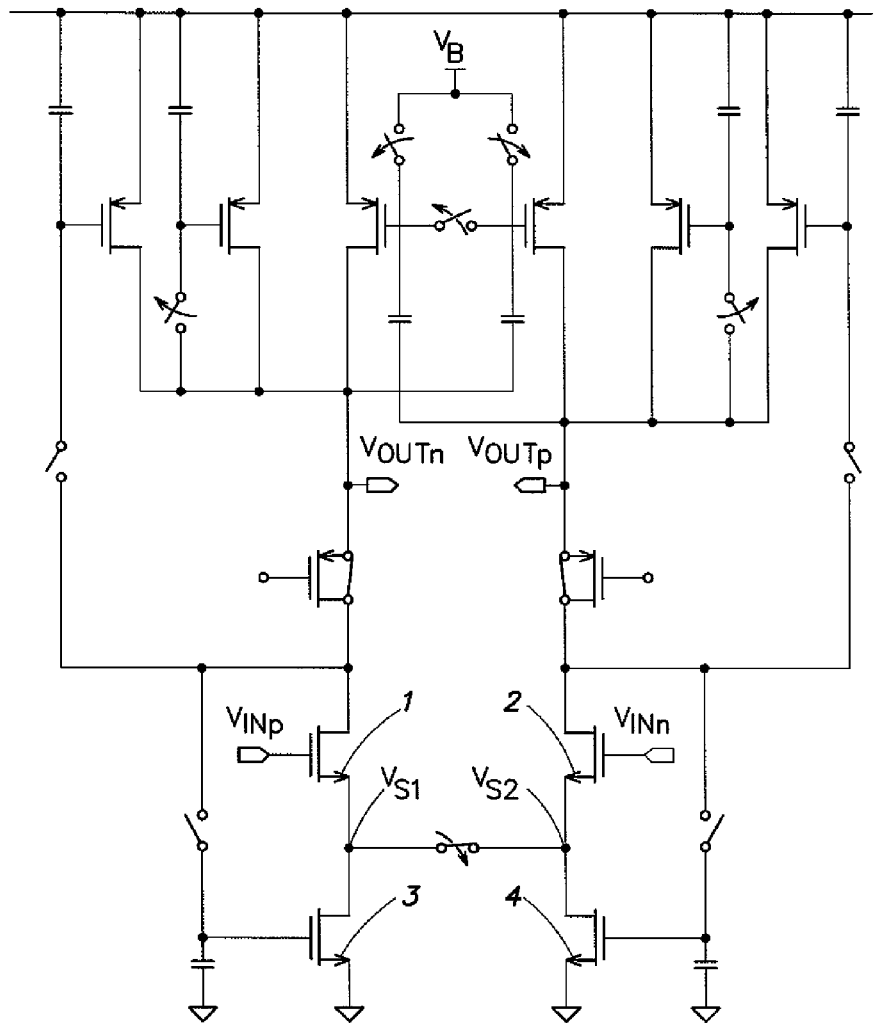
FIG. 2 is a circuit diagram of a second known solution.
Figure 3:
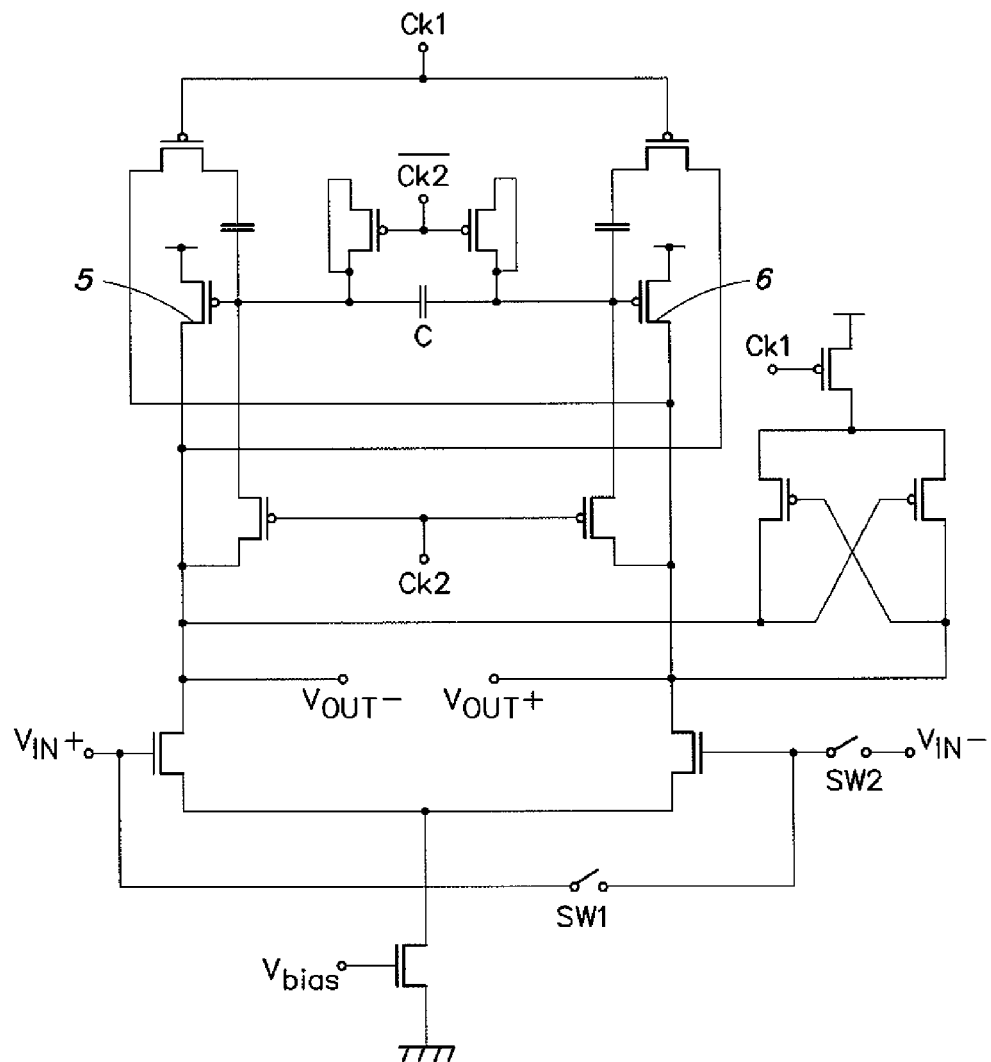
FIG. 3 is a circuit diagram of a third known solution.
Figure 4:
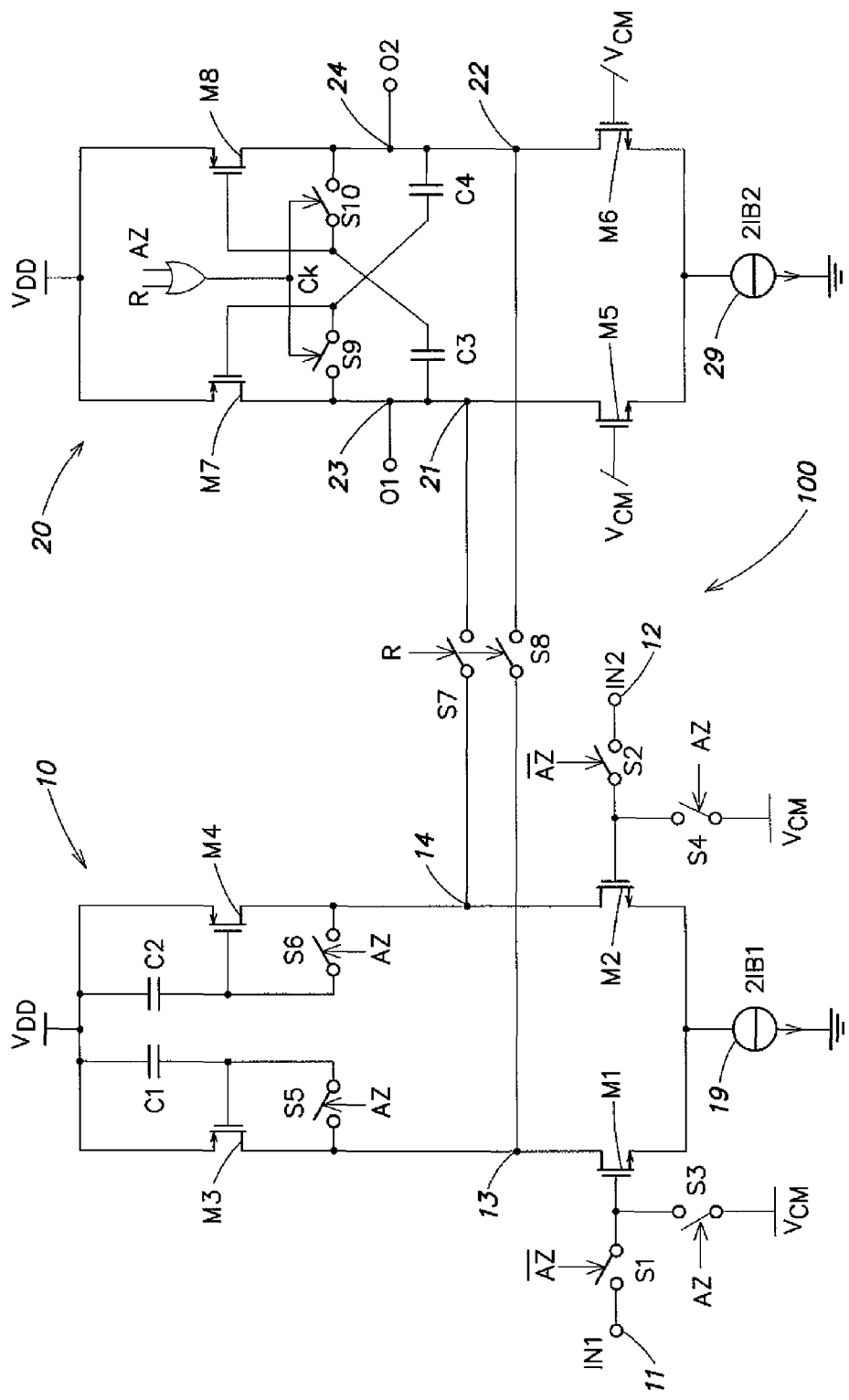
FIG. 4 is a circuit diagram of an embodiment of the present comparator.

FIG. 4 shows a comparator 100 comprising two stages 10, 20 which are cascade connected and controlled by two synchronization signals (autozero signal AZ and reset signal R) so as to operate according to three steps, including a autozeroing step, a tracking step and an evaluating step (unbalancing and latching). The autozeroing step may be performed once at the beginning of a series of comparison operations, while the tracking and evaluating steps are performed in a sequence one after another, for each comparison operation of the series.

In comparator 100, a first stage 10 substantially forms a voltage/current converter which, during the autozeroing step, stores an offset-compensated bias condition thereof, so that during the subsequent tracking and evaluating steps, it may generate, on its outputs 13 and 14, current signals $+i_{in}$ and $-i_{in}$ dependent on input signals IN1 and IN2 received on its inputs 11 and 12, but independent of the offset of first stage 10.

A second stage 20 forms a latched comparator, which is held in a reset condition during the autozeroing step, connected to first stage 10 during the tracking step, so as to receive current signals I1 and I2 on its inputs 21 and 22 and store an offset-compensated bias condition thereof, and is disconnected from first stage 10 during the evaluating step, so as to switch and generate, on comparison outputs 23 and 24, output signals O1, O2 only dependent on input signals IN1 and IN2.

In detail, first stage 10 comprises a pair of input transistors M1, M2, herein of the NMOS type, having gate terminals connectable respectively to input 11 and input 12 through respective switches S1 and S2. Furthermore, the gate terminals of input transistors M1, M2 are connectable to a common mode DC voltage VCM through respective switches S3 and S4. First terminals (herein the source terminals) of input transistors M1, M2 are connected together and to a first current source 19 supplying a first bias current IB1. Second terminals (herein drain terminals) of input transistors M1, M2 are connected to a respective output 13, 14 of the first stage and to first terminals (herein drain terminals) of a pair of load transistors M3, M4, herein of the PMOS type. Second terminals (herein source terminals) of load transistors M3, M4 are connected to a supply voltage VDD. Capacitors C1 and C2 are connected between drain and gate terminals of a respective load transistor M3, M4; switches S5 and S6 are connected between the gate and source terminals of a respective load transistor M3, M4.

The outputs 13, 14 of the first stage are connectable to inputs 21 and 22 of second stage 20 through respective switches S7 and S8. Inputs 21 and 22 of second stage 20 (also forming outputs of comparator 100) are connected to first terminals (herein drain terminals) of a pair of bias transistors M5, M6, herein of the NMOS type. Second terminals (herein source terminals) of bias transistors M5, M6 are connected together and to a second current source 29 supplying a second bias current IB2. Inputs 21 and 22 of second stage 20 are also connected to first terminals (herein drain terminals) of a pair of output transistors M7, M8, herein of the PMOS type. Second terminals (herein source terminals) of output transistors M7, M8 are connected to a supply voltage VDD. Capacitors C3 and C4 are connected between the drain terminal of a respective output transistor M7, M8 and the gate terminal of the other output transistor M8, M7; switches S9 and S10 are connected between the gate and drain terminals of a respective output transistor M7, M8.

Figure 5:
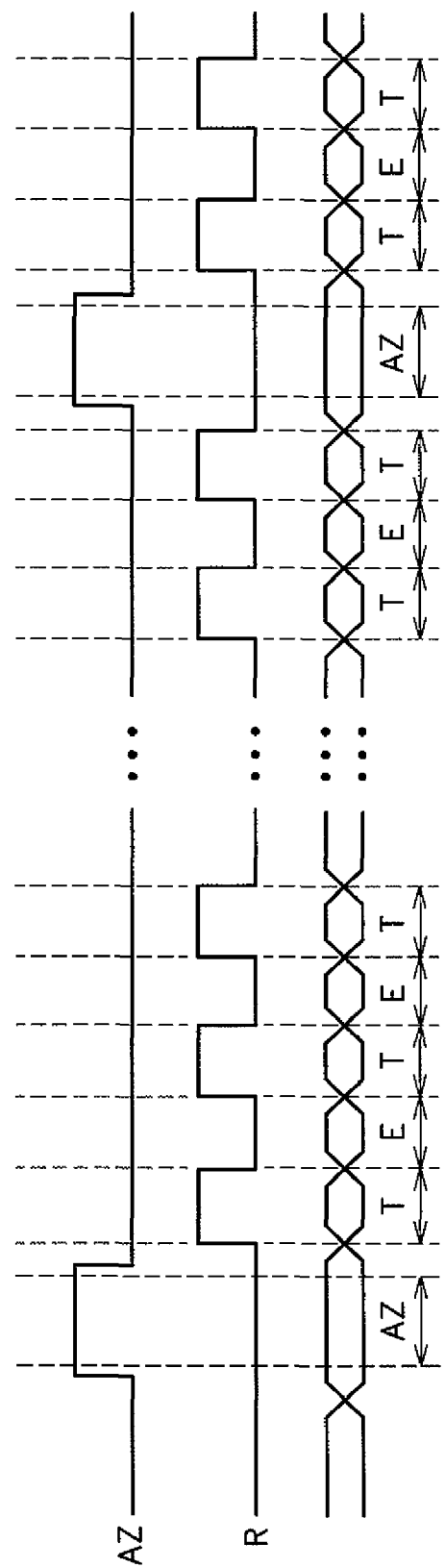
FIG. 5 shows the plot of the control signals of the comparator of FIG. 4.

Switches S1-S10 receive control signals resulting from combinations of two synchronism signals AZ and R (shown in FIG. 5), so as to obtain a sequence of autozeroing step AZ, tracking step T and evaluating step E. For instance, switches S3-S6 receive autozero signal AZ, switches S1, S2 receive inverted autozero signal $\overline{AZ}$; switches S7 and S8 receive reset signal R and switches S9 and S10 receive a control signal CK, which is the combination of autozero signal AZ and reset signal R and is such as to maintain them closed during the autozeroing and tracking steps and open during the evaluating step.

Figure 6:
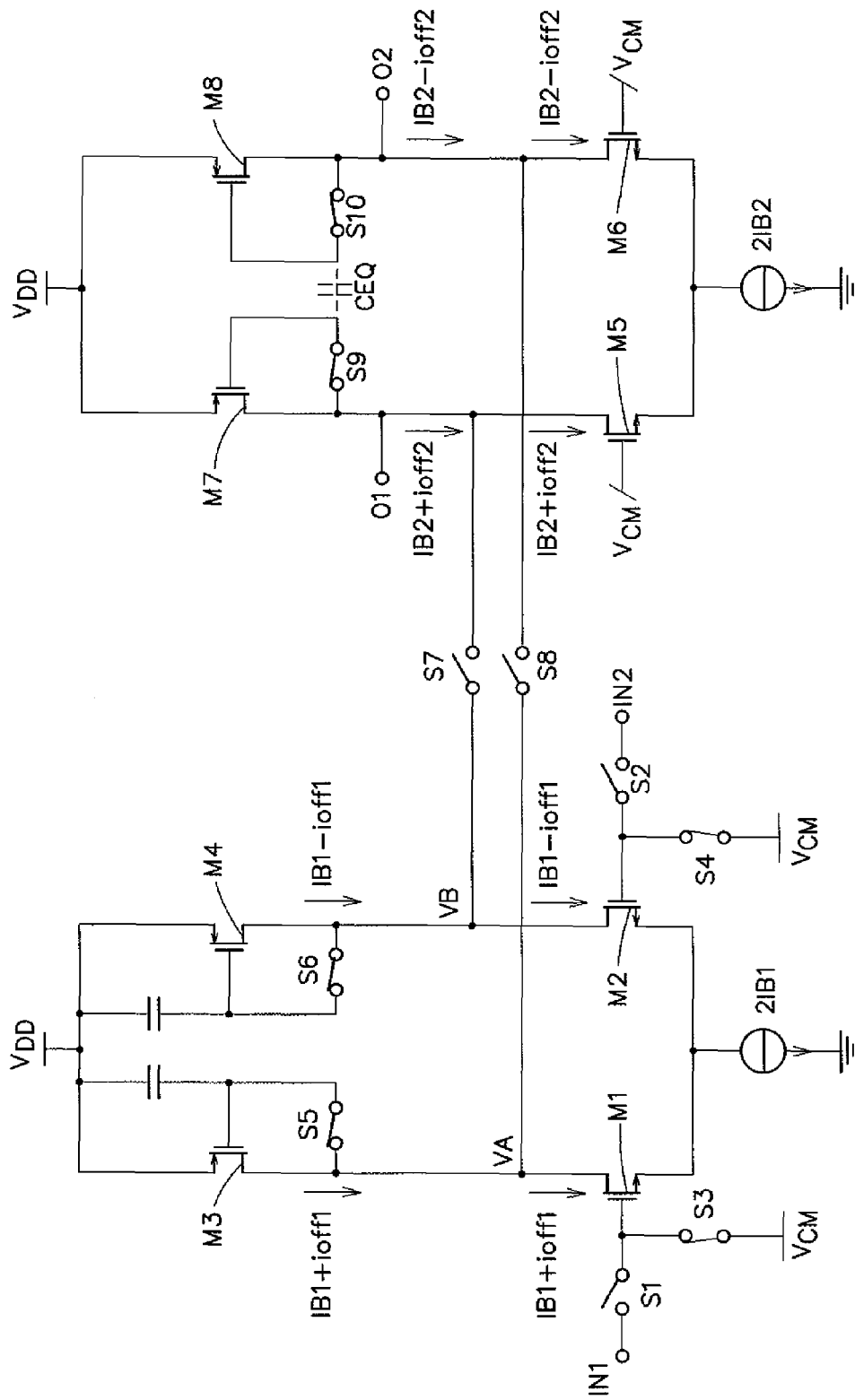
FIGS. 6-8 show equivalent circuit diagrams of the comparator of FIG. 4, in three different operative steps.
Figure 7:
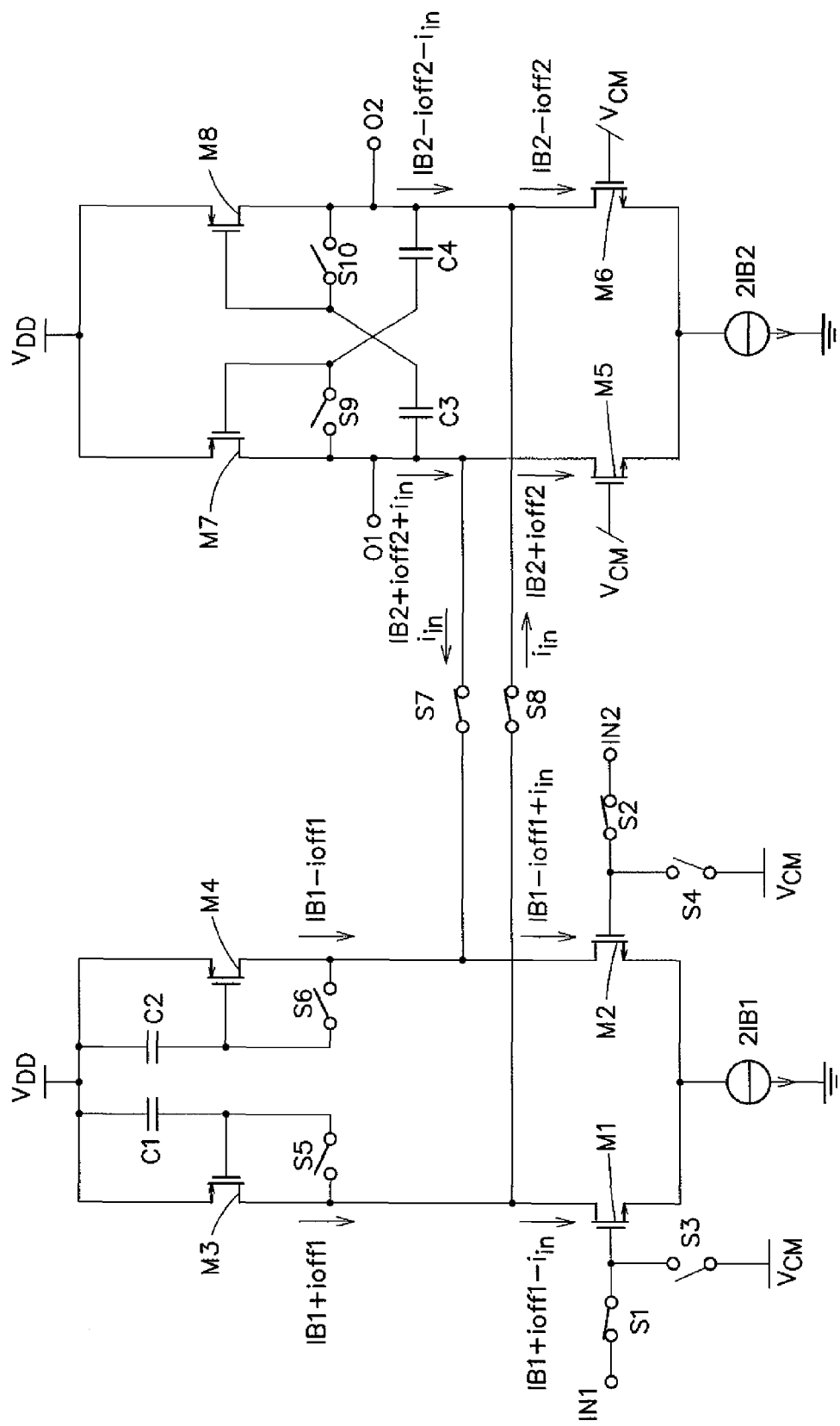
Figure 8:
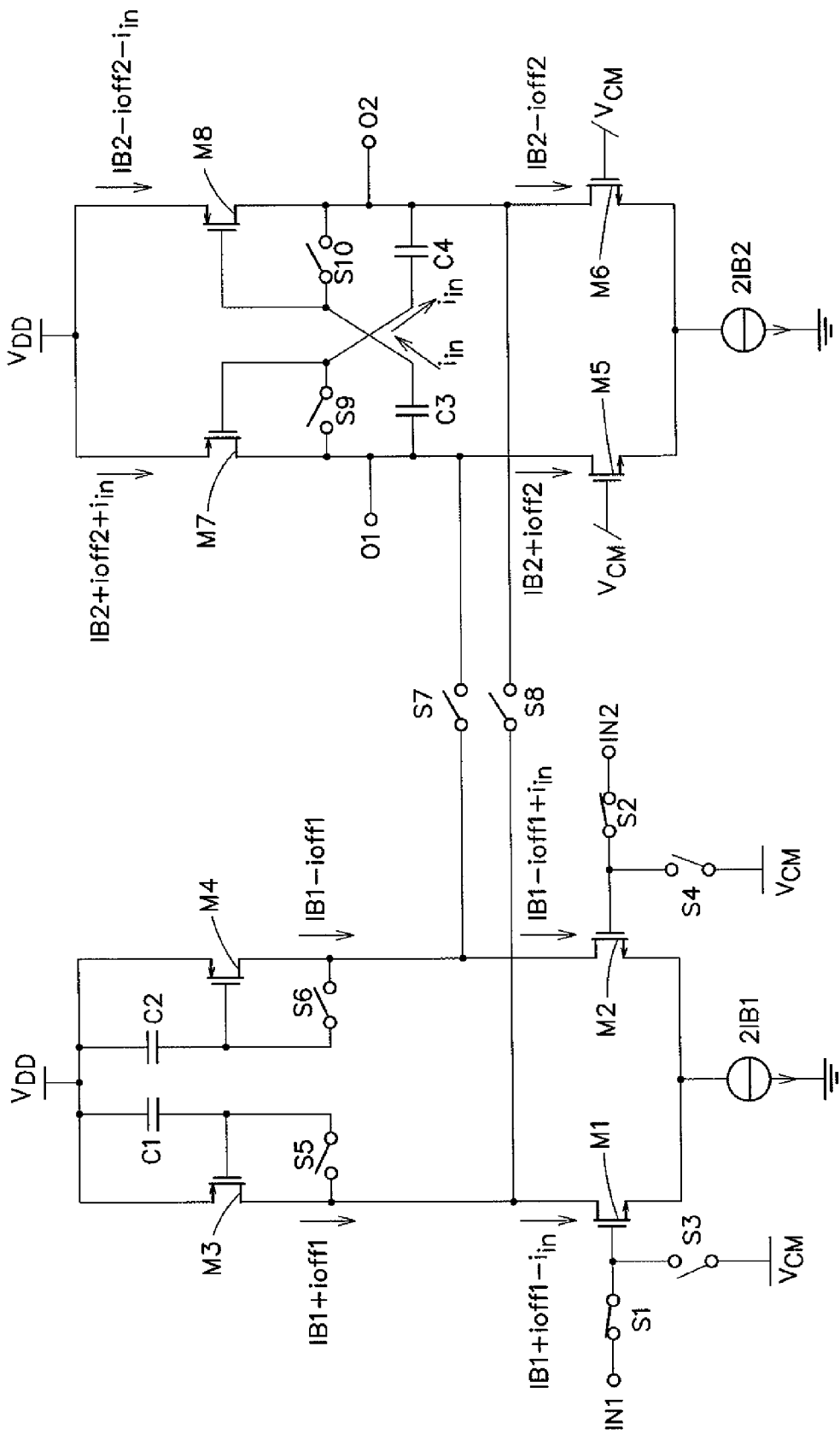

The operation of comparator 100 of FIG. 4 will now be disclosed with reference to FIGS. 6-8, showing the equivalent circuit of comparator 100 respectively in the autozeroing, tracking and evaluating steps.

Autozeroing Step

In this step, switches S1, S2, S7, S8 are open and switches S3, S4, S5, S6, S9, S10 are closed. Accordingly, the gate terminals of input transistors M1, M2 of first stage 10 are connected to common mode DC voltage VCM; outputs 13 and 14 of first stage 10 are disconnected from second stage 20; load transistors M3 and M4 are in a transdiode configuration and second stage 20 is in a reset state.

In this configuration, shown in FIG. 6, load transistors M3 and M4 are respectively biased with the current set by input transistor M1, M2 connected thereto, equal to IB+ioff1 and IB−ioff1. During this step, capacitors C1 and C2 store voltages VGS of load transistors M3 and M4 corresponding to these currents.

Second stage 20 is maintained in a reset state, with a disabled positive feedback, due to switches S9 and S10 closing. In this condition, capacitors C3 and C4 are equivalent to a single capacitance Ceq=C3+C4 connected between the gate terminals of output transistors M7 and M8.

Tracking Step

At the beginning of this step, switches S3 and S4 are opened and switches S1 and S2 are closed. Furthermore, switches S5 and S6 are opened and switches S7 and S8 are closed, connecting first stage 10 to second stage 20 through a low impedance path; switches S9 and S10 remain closed, maintaining output transistors M7, M8 in a transdiode configuration. Comparator 100 is therefore in the configuration shown in FIG. 7.

Thereby, input signals IN1 and IN2 are applied to input transistors M1, M2 which respectively conduct currents IB+ioff1−$i_{in}$ and IB−ioff1+$i_{in}$. Since capacitors C1 and C2 hold the gate-source voltage of load transistors M3, M4 constant, the latter do not modify the current flowing therethrough and the signal currents −$i_{in}$ and +$i_{in}$ flow through the low impedance path between first and second stage 10, 20.

Accordingly, signal current −$i_{in}$ and +$i_{in}$ flows in output transistors M7, M8, as well as bias current IB2±ioff2 due to second generator 29. The currents of output transistors M7, M8 are therefore equal to IB2+ioff2+$i_{in}$ and IB2−ioff2−$i_{in}$, respectively.

In this step, capacitors C3 and C4 in parallel to one another store the voltage existing between outputs 21 and 22 of comparator 100, dependent on offset currents ±ioff2 of second stage 20.

Evaluating Step

At the beginning of this step, switches S7, S8, S9 and S10 are opened, while switches S1-S6 remain in the previous condition, as shown in FIG. 8, relating to the time at which switches S7 and S8 are opened. In this condition, second stage 20 is disconnected from first stage 10. Immediately after switching switches S7-S10, signal current $i_{in}$ of first stage 10 flows towards parasitic capacitances associated to nodes 13 and 14, while the currents flowing through output transistors M7, M8 remain unaltered with respect to the previous step, as capacitors C3 and C4 hold the voltages constant on their gate terminals. As bias transistors M5 and M6 receive the common mode DC voltage VCM on the gate terminals thereof and therefore currents IB2+ioff2 and IB2−ioff2 continue to respectively pass therethrough, signal current $i_{in}$ starts to flow in capacitors C3 and C4, modifying the voltage drop across them and triggering a positive feedback that allows the switching of outputs 21, 22. This switching develops according to a direction exclusively depending on signal current $i_{in}$.

Thereafter, comparator 100 goes back to the tracking step. The first stage therefore generates a new value of signal current $i_{in}$ flowing towards/from second stage 20, analogously to what disclosed above. A subsequent evaluating step therefore leads to the generation of a new output.

Resampling the offset of the whole comparator 100 by shorting the inputs of the common mode is not required after each single comparison operation (tracking and evaluating) with the shown circuit. Indeed, the overall offset of comparator 100 depends on the sum of the offset contributions of the first and second stages. The offset of first stage 10 is stored during the initial autozeroing step and maintained for the whole duration of the subsequent N comparisons. The information on the offset of second stage 20, although lost at each comparison, is recovered during the subsequent tracking step, without requiring additional steps.

Figure 9:
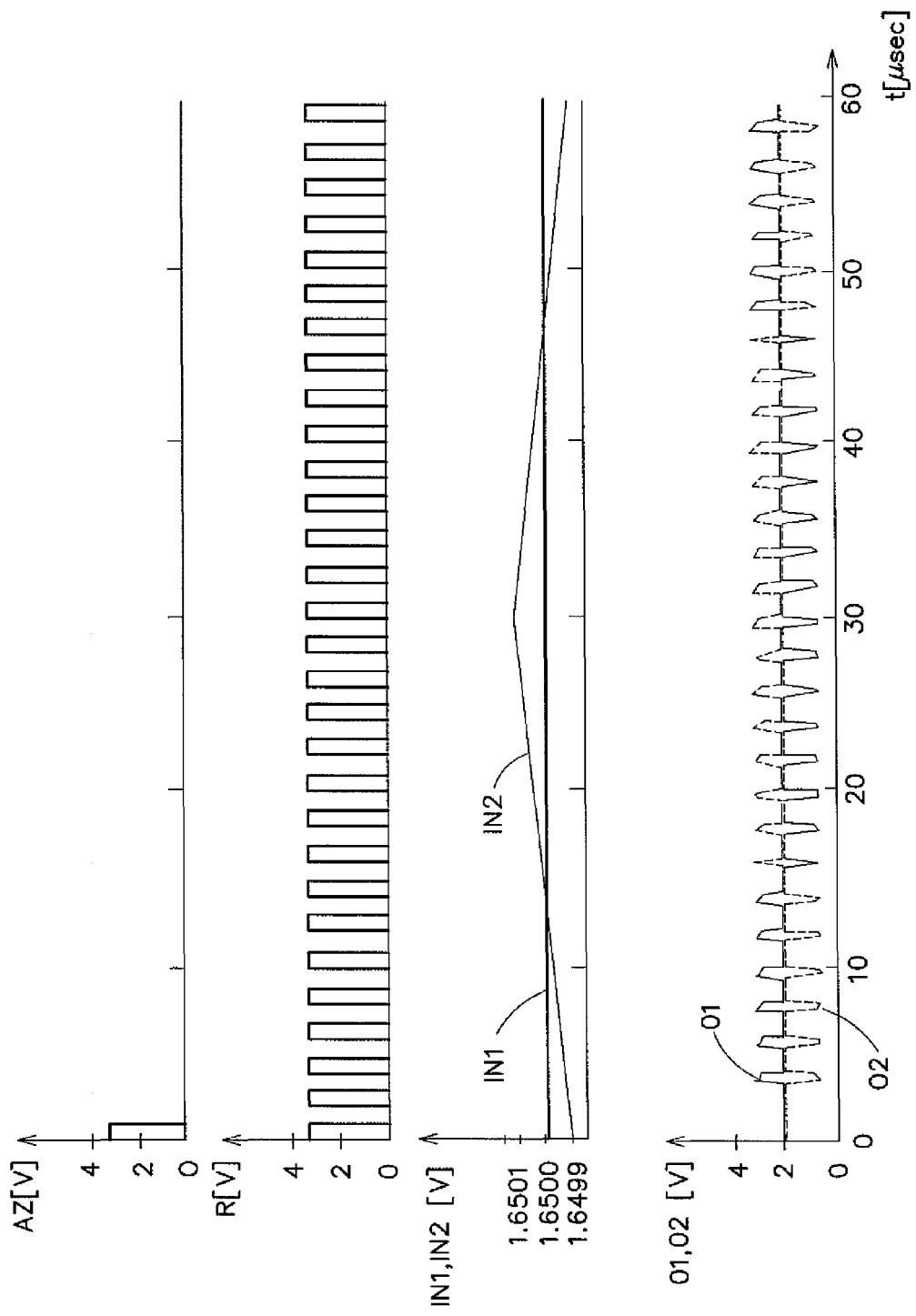
FIG. 9 shows a simulation referring to the comparator of FIG. 4.

Thereby, a series of comparisons may be performed by alternating the tracking and evaluating steps, as shown in FIG. 9, relating to the simulation of a transient wherein input 11 of comparator 100 receives a ramp signal IN1, while input 12 is maintained at a constant voltage, for instance the common mode voltage (IN2=1.650 V). As may be noted, the autozeroing step is performed only initially and reset signal R determines alternating of the tracking and evaluating steps (and more precisely, the tracking step occurs when reset signal R is high and the evaluating step occurs when signal R is low).

The comparator disclosed herein has several advantages.

In particular, the circuit is very simple, comprises few auxiliary components, so that its implementation requires a rather limited area.

The cancellation of the offset also requires only two control signals and only one additional step (autozeroing step). Indeed, the tracking step requires no additional times with respect to other kinds of comparators, which in any case comprise a resetting step, corresponding to the tracking step in the present comparator.

The solution shown is also compatible with the use of low-gain preamplification stages upstream of the comparator, as the autozeroing step is performed only once, as explained above.

Furthermore, the circuit allows a reduction in the input noise during the comparison due to switching of the outputs, the so-called "kick-back". Indeed, during switching of the outputs, second stage 20 is electrically disconnected from first stage 10, by virtue of the opening of switches S7 and S8.

Figure 10:
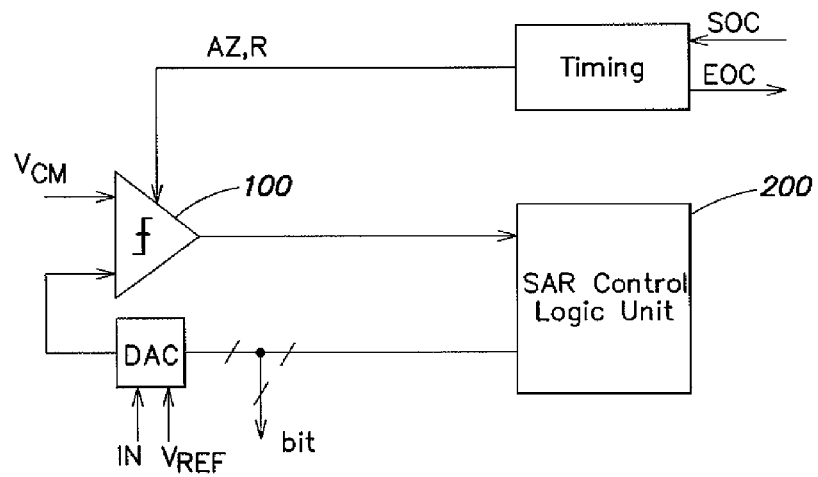
FIG. 10 is block diagram of an ADC SAR converter using the comparator of FIG. 4.
Figure 11:
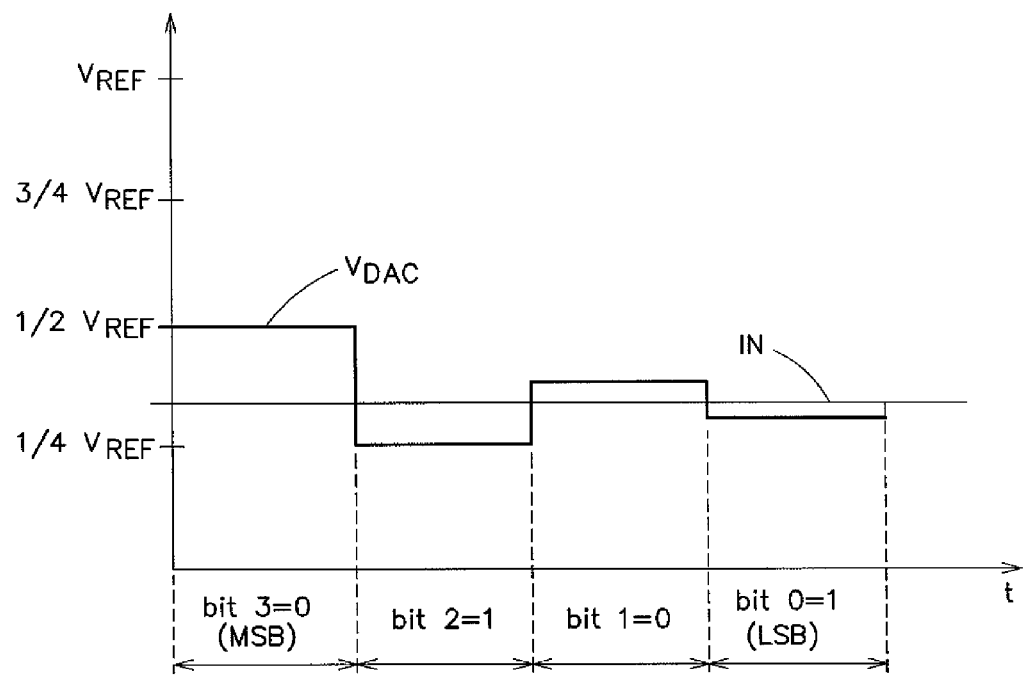
FIG. 11 shows the output signal of the converter of FIG. 10.

Comparator 100 may be used for providing an analog digital converter ADC SAR, as shown in FIGS. 10 and 11. Namely, digital analog converter DAC samples input signal IN on its input capacitances; furthermore it also receives a level of reference voltage $V_{REF}$ and the output of the SAR control logic unit providing, at each comparison, an output bit. The DAC converter therefore subtracts input signal IN from a reference signal corresponding to the bits generated by the SAR control logic unit ($V_{DAC}$ in FIG. 11). Initially, the output bit is set to 1 and the DAC converter subtracts input signal IN from $V_{REF}/2$. The result of the subtraction is compared in comparator 100 with common mode voltage $V_{CM}$ and the output signal of comparator 100 is supplied to the SAR control logic unit which generates the most significant bit (in the example of FIG. 11, MSB=bit3=0). Accordingly, in the subsequent comparison cycle $V_{DAC}$ is equal to $V_{REF}/4$ and the subsequent bit generated by the SAR control logic unit is equal to "1" (in FIG. 11, bit2). The comparison cycles are repeated several times, on the basis of the desired discretization level. In FIG. 10, signal SOC is the conversion activation signal and signal EOC is the conversion end signal.

The use of comparator 100 of FIG. 4 in ADC SAR converter 200 of FIG. 10 is especially advantageous, as the entire operation of conversion requires several subsequent comparing steps, without the need to resample the offset. Namely, in this case, the autozeroing step may be performed only before each conversion operation and the subsequent comparing steps for the generation in a sequence of output bits include only one sequence of tracking and evaluating steps. Furthermore, during the tracking step, the DAC converter develops its output state, so that the tracking step requires no additional times in the overall process.

Comparator 100 may also be used in various application fields, such as for instance the automotive, the consumer electronics or the sigma-delta converter field.

It is finally apparent that modifications and variants can be made to the comparator disclosed and illustrated herein without departing from the scope of protection of the present invention, as defined in the appended claims.

For instance, switches S9 and S10 connected to output transistors M7 and M8 could be directly controlled by the reset signal and therefore be opened during the autozeroing step, as second stage 20 is in any case decoupled from first stage 10.

Moreover, the components can be replaced by other equivalent elements, for example bipolar transistors and/or of different type.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A comparator, comprising a first stage and a second stage, the first stage being configured so as to receive a voltage input signal and generate a current signal,
the second stage comprising:
a first and a second output transistor connected between a reference potential line and, respectively, a first and a second comparator output node;
a pair of bias devices, connected between a respective comparator output node and an output bias current source;
a first memory element, connected between a control terminal of the first output transistor and the second comparator output node;
a second memory element, connected between a control terminal of the second output transistor and the first comparator output node; and
bias switches coupled between a control terminal of a respective output transistor and a respective comparator output node, wherein
there is no additional memory element connected between the control terminal of the first output transistor and the control terminal of the second output transistor.

2. The comparator according to claim 1, wherein the first stage comprises a first and a second converter output node, the comparator further comprising a pair of connection switches interposed between a respective converter output node and a respective comparator output node, the connection switches and the bias switches being configured so that, in a tracking step, the first stage is connected to the second stage and the first and second memory elements store a control voltage of the respective output transistor and, in a evaluating step, the first stage is disconnected from the second stage and the memory elements receive said current signal and switch said first and second output nodes according to said current signal.

3. The comparator according to claim 1, wherein the first and the second memory elements are capacitors.

4. The comparator according to claim 1, wherein the first stage comprises first and second input transistors and first and second load transistors interposed between the reference potential line and an input bias current source, said first and second input transistors being connected to said first and second load transistors at respective converter output nodes.

5. The comparator according to claim 4, further comprising a third and a fourth memory element interposed between the control terminal of the first and, respectively, of the second load transistor and the reference potential line.

6. The comparator according to claim 5, wherein the first stage further comprises:
an input circuit connected to said input transistors and configured so as to supply a reference signal in an autozeroing step and said input signal in a comparing step;
a first and a second autozero switch interposed between a control terminal of a respective load transistor and a respective converter output node and configured so as to receive an autozero signal so that, in the autozeroing step, the load transistors are transdiode-connected and the third and fourth memory elements store a signal correlated to an offset of the first stage and, in the comparing step, the first and the second autozero switches are open and the first stage supplies the current signal to the converter output nodes.

7. The comparator according to claim 6, wherein the input circuit comprises a first switch interposed between a first comparator input and a control terminal of the first input transistor, a second switch interposed between a second comparator input and a control terminal of the second input transistor; a third switch interposed between the control terminal of the first input transistor and a common mode voltage and a fourth switch interposed between the control terminal of the second input transistor and the common mode voltage, the first and the second switch being configured so as to switch on in counterphase with respect to the third and fourth switches.

8. An ADC SAR converter, comprising the comparator according to claim 1.

9. A method of comparing a voltage signal supplied to a comparator comprising a first stage receiving an input signal and a second stage outputting an output signal, the method including a tracking step and an evaluating step, wherein the tracking step comprises:
generating current signals related to the input signal by the first stage;
supplying the current signals to a pair of output transistors of the second stage at respective comparator output nodes, wherein the pair of output transistors are connected between a reference potential line and the respective comparator output nodes;
connecting control terminals of the pair of output transistors to the respective comparator output nodes; and
storing control voltages existing between each control terminal of the pair of output transistors and an opposite comparator output node;
and wherein the evaluating step comprises:
disconnecting current flow between the first stage and the second stage;
disconnecting the control terminals of the output transistors from the respective comparator output nodes; and
detecting the output signals on the comparator output nodes.

10. The method according to claim 9, further comprising an autozeroing step including acts of:
- disconnecting current flow between the first stage and the second stage;
- providing a reference signal to a pair of input transistors in the first stage, the pair of input transistors connected between respective converter output nodes and a first current source;
- connecting control terminals of a pair of load transistors in the first stage to respective converter output nodes; and
- storing bias voltages at the control terminals of the pair of load transistors.

11. The method according to claim 10, wherein the step of storing bias voltages further comprises disconnecting each control terminal of the pair of load transistors from the respective converter output nodes.

12. The method according to claim 10, wherein the tracking step further comprises:
- supplying the input signal to control terminals of the input transistors; and
- maintaining the bias voltages on the control terminals of the load transistors.

13. The method according to claim 12, further comprising, following the autozeroing step, repeating the tracking step and the evaluating step several times in a sequence.

14. The method according to claim 10, wherein the reference signal is applied to each control terminal of the pair of input transistors.

15. A comparator comprising:
- a first stage configured to convert an input signal to at least one current signal;
- a second stage configured to convert the at least one current signal into at least one comparator output signal; and
- at least one coupling switch for connecting or disconnecting at least one signal path configured to carry the at least one current signal to at least one input node of the second stage, wherein the second stage comprises:
  - a first load transistor configured in a first branch of the second stage, and having its main terminals connected between a first potential and a first input node of the at least one input node;
  - a first load transistor switch configured to couple or decouple a control terminal of the first load transistor to the first input node;
  - a second load transistor configured in a second branch of the second stage that is parallel to the first branch, and having its main terminals connected between the first potential and a second input node of the at least one input node;
  - a second load transistor switch configured to couple or decouple a control terminal of the second load transistor to the second input node.

16. The comparator of claim 15, further comprising:
- a first biasing transistor having its main terminals connected between the first input node and a current source; and
- a second biasing transistor having its main terminals connected between the second input node and the current source, wherein
- the control terminals of the first and second biasing transistors are configured to be coupled to a constant voltage source.

17. The comparator of claim 15, further comprising:
- a first capacitive element connected between a first control terminal of the first load transistor and the second input node; and
- a second capacitive element connected between a second control terminal of the second load transistor and the second input node.

18. The comparator of claim 17, wherein there is no additional capacitive element coupling the first control terminal of the first load transistor to the second control terminal of the second load transistor.

* * * * *